Oct. 15, 1957 H. J. PAZ 2,810,110

SEMI-CONDUCTOR MODULATION CIRCUITS

Filed July 16, 1954

INVENTOR.
Harold J. Paz

BY H. W. Newton

ATTORNEY

United States Patent Office 2,810,110

Patented Oct. 15, 1957

2,810,110

SEMI-CONDUCTOR MODULATION CIRCUITS

Harold J. Paz, Bronx, N. Y., assignor to Radio Corporation of America, a corporation of Delaware Application July 16, 1954, Serial No. 443,750

11 Claims. (Cl. 332—52)

Figure 1:
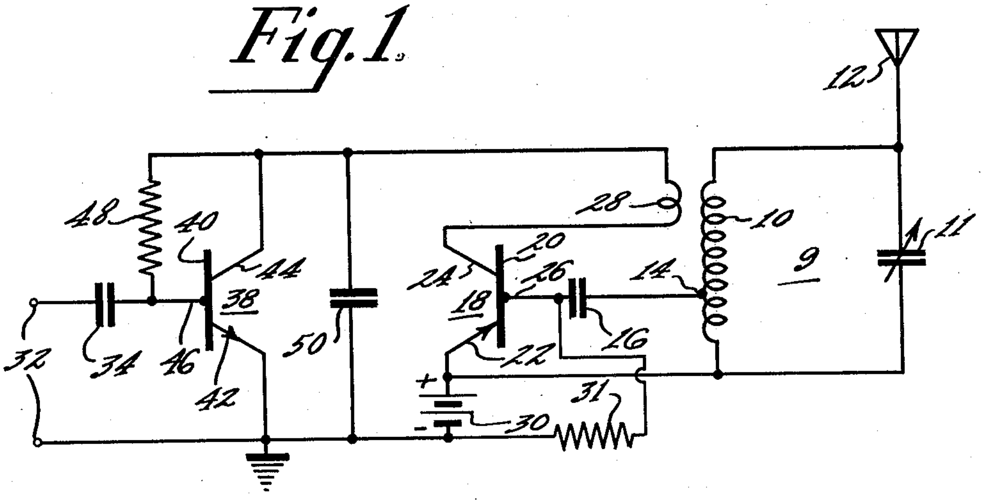

This invention relates in general to modulated oscillator circuits, and in particular to modulated semi-conductor oscillator circuits arranged to produce amplitude modulated carrier wave energy.

In order to convey signal intelligence from one point to another by means of carrier wave energy, the carrier wave is modulated at the transmitting point by signal intelligence. This may be accomplished, for example, by the application of a modulating voltage to an oscillator circuit. Modulation is accomplished by varying the amplitude of the generated oscillations with the modulating voltage.

Transistors may be adapted to modulation circuits of the type referred to, for modulating carrier wave energy. Transistors, however, as distinguished from electron discharge devices, may be of opposite conductivity or complementary symmetry types as disclosed, for example, in an article by George C. Sziklai, in the June 1953 "Proceedings of the I. R. E.," (pages 717–724). This characteristic of transistors, for which there is no known electron discharge tube equivalent, is utilized in accordance with the present invention in improved amplitude modulation circuits.

One known method of accomplishing amplitude modulation of a transistor oscillator circuit as referred to above is to serially connect a transformer with the power supply and the collector of the oscillator circuit transistor. By this expedient, the voltage which is applied to the transformer is used to vary the collector-to-emitter voltage of the oscillator circuit transistor, thus amplitude modulating the oscillator circuit. Certain disadvantages are inherent in this method such as the relatively high cost of the transformer and the fact that the frequency response of the transformer may be limited for certain applications.

It is, accordingly, an object of the present invention to provide an improved and reliable amplitude modulation circuit which may effectively utilize semi-conductor devices of opposite conductivity types for improved operation and efficiency.

It is a further object of the present invention to provide a simple and reliable modulated oscillator circuit utilizing semi-conductor devices of the opposite conductivity type which does not require modulation transformer means.

It is still another object of the present invention to provide an improved modulated oscillator circuit which may utilize a pair of opposite conductivity type transistors to provide relatively wide frequency response and stable, efficient and reliable circuit operation at all times.

These and further objects and advantages of the present invention are achieved in general by connecting a transistor, which serves as the modulation element, in series with the power supply and the transistor which serves as the active element of an oscillator circuit. The two transistors are of opposite conductivity types. By applying a signal to the modulation transistor, the voltage between its electrodes will vary causing the electrode voltages on the oscillator transistor to vary which will, in turn, vary the amplitude of the oscillator signal. In one aspect the modulation transistor is connected in a grounded emitter circuit configuration and in another aspect it is connected in a grounded collector circuit configuration.

Figure 2:
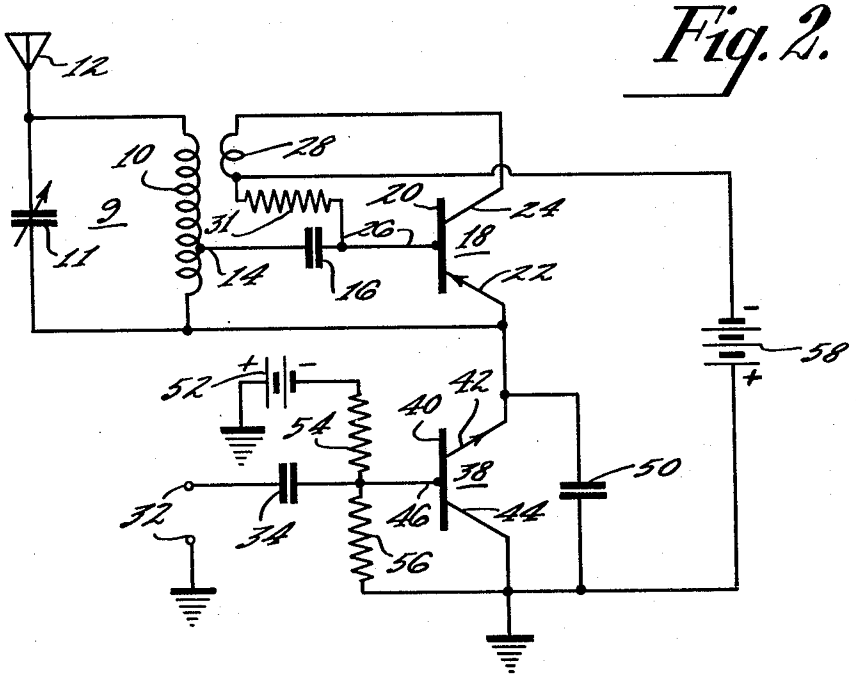

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figures 1 and 2 are schematic circuit diagrams of modulated oscillator circuits utilizing opposite conductivity transistors in accordance with the invention.

Referring now to the drawing, wherein like elements are designated by like reference numerals in both figures, and referring particularly to Figure 1, an inductor 10 and a variable capacitor 11 are arranged as a parallel resonant circuit 9 which is the frequency determining circuit of the oscillator circuit and which is tuned to the center frequency or carrier wave frequency of the energy to be generated. A radiating element such as an antenna 10 is connected with the upper end of the frequency determining circuit 9. The active element of the oscillator circuit comprises a P–N–P junction transistor 18, the base electrode 26 of which is coupled through a coupling capactor 16 to a tap 14 on the inductor 10. In addition to the base electrode 26, the P–N–P junction transistor 18 includes a semi-conductive body 20 and two other electrodes which are associated with the body 20 in a well known manner and are designated as an emitter 22 and a collector 24.

The lower end of the frequency determining circuit 9 is connected directly with the emitter electrode 22 of the transistor 18. A source of direct current operating bias may be provided, such as illustrated by a battery 30, the positive terminal of which is connected directly with the emitter 22, and the negative terminal of which is connected to a source of fixed reference potential or ground for the system as shown. A feedback inductor 28 is inductively coupled with the inductor 10 of the frequency determining circuit 9 and has one end connected directly with the collector 24 of the oscillator transistor 18, and its other end connected with the collector electrode 44 of the modulating element or transistor 38. A resistor 31 is connected between the base 26 and the negative terminal of the battery 30.

The modulating element, in accordance with the present invention, comprises the transistor 38 which is of an opposite conductivity type to the P–N–P junction oscillator transistor 18. Accordingly, the transistor 38 has been illustrated as being of the N–P–N junction type and includes a semi-conductive body 40 and three electrodes which are cooperatively associated with the body in a well known manner. These electrodes have been designated, as is conventional, as an emitter 42, a collector 44 and a base 46.

The emitter 42 of the transistor 38 is connected directly to ground so that the input circuit of the transistor 38 may be connected to a low impedance source of modulating signal energy. Base bias for the transistor 38 is provided by connecting a resistor 48 between the collector 44 and the base 46. To by-pass radio frequency signals to ground, a by-pass capacitor 50 is connected between the collector 44 and the emitter 42 or ground as shown. It is apparent that through the connections shown and described a continuous direct current path exists from ground through the emitter 42 and collector 44 of the N–P–N transistor 38 and the collector 24 and emitter 22 of the P–N–P transistor 18 to the positive terminal of the biasing battery 30.

It should be noted that while the transistors 18 and 38 have been illustrated as being of the P–N–P and N–P–N junction type respectively, their conductivity could be reversed so long as the polarity of the biasing source is also reversed. Moreover, the invention is not restricted to junction transistors, and other types of transistors having similar characteristics could be used. Thus the present invention should be taken as applying equally well to other types of transistors, so long as they are of opposite conductivity types.

The input circuit for the modulating transistor 38 includes a pair of input terminals 32, one of which is grounded and the other of which is connected through a coupling capacitor 34 to the base 46 of the modulating transistor 38. To these input terminals, a modulation signal such as, for example, an audio frequency signal will normally be applied.

The oscillator portion of this circuit operates in the manner of a conventional junction transistor oscillator, that is, the parallel resonant tuned circuit 9, comprising the inductor 10 and the capacitor 11, determines the operating frequency of the oscillator circuit. Energy is fed back from the inductor 10 by means of the mutual coupling between it and the feedback inductor 28 to the collector 24 of the transistor 18. This feedback energy is provided in phase and magnitude, through the coupling shown, to overcome the losses in the circuit and thereby sustain continuous oscillation of the circuit.

Amplitude modulation of this generated energy is accomplished by provision of the circuitry as shown and described. Thus when a modulation signal is applied to the input terminals 32, it will cause the voltage in the output circuit of the modulating transistor 38 to vary in proportion to the variations in amplitude of the applied modulation signal. This voltage will then cause the voltage between the collector and the emitter of the oscillator transistor 18 to vary in proportion to the amplitude of the applied modulation signal. Since, however, the radio frequency signal output of the oscillator circuit is proportional to the collector voltage of the transistor 18, the oscillator signal will be amplitude modulated. Accordingly, the energy radiated from the antenna 12 is amplitude modulated in accordance with the signal which is applied to the terminals 32.

As described, it is evident that by provision of the present invention, amplitude modulation of a transistor oscillator circuit is easily and efficiently accomplished by utilizing a pair of transistors of opposite conductivity types. These results are accomplished, moreover, without the provision of the usual modulation transformer. Since there is no basic frequency limitation on the circuit, amplitude modulation over a wider bandwidth than is usual may be accomplished.

As was explained hereinbefore, by utilizing a grounded emitter transistor as the modulating element as in Figure 1, the transistor 38 may be connected to a relatively low impedance source of modulation signals. For some applications, however, it may be desirable to connect the modulating transistor to a high impedance input source of input signals. This may be accomplished, by the circuit illustrated in Figure 2 of the drawing, reference to which is now made.

In Figure 2 the modulating transistor 38 has its collector 44 grounded, so that the transistor 38 presents a relatively high input impedance. Biasing potentials for the transistor 30 are provided, in this figure, by a battery 52, the positive terminal of which is grounded as shown and the negative terminal of which is connected through a resistor 54 to the base 46 of the transistor 38. A further biasing resistor 56 is connected between the base 46 and the collector 44 of the transistor 38. As in Figure 1, one of the input terminals is grounded, while the other is connected through a coupling capacitor 34 to the base 46 of the transistor 38.

The oscillator portion of the modulation circuit in the embodiment of the invention illustrated in Figure 2 is similar to the one illustrated in Figure 1. Thus it includes a frequency determining circuit 9 and an active element which has been illustrated as being a P–N–P junction transistor 18. Regenerative feedback for sustained oscillation is similarly provided through the inductive feedback winding 28 which is inductively coupled to the inductor 10 of the frequency determining circuit 9. To provide collector biasing voltages in accordance with this embodiment of the invention a biasing battery 58 is provided, the positive terminal of which is returned to ground as shown and the negative terminal of which is connected through the feedback winding 28 to the collector 24 of the transistor 18. The emitter electrodes 22 and 42 of the oscillator transistor 18 and the modulating transistor 38 respectively are directly connected together.

Thus the circuit illustrated in Figure 2 is seen to operate in a similar manner to the circuit illustrated in Figure 1. That is, when a modulating signal, such as an audio frequency signal, is applied to the terminals 32, the output voltage of transistor 38 will be varied in proportion to the variations in amplitude of the applied modulation signal. This voltage will then be applied between the collector 24 and the emitter 22 of the oscillator transistor 18. Thus the oscillator signal will be amplitude modulated.

As described herein modulated semi-conductor oscillator circuits are characterized by the simplicity of the circuit connections. In addition, the circuits are reliable, efficient and stable, and have a relatively wide frequency response. Since the circuits use transistors exclusively as active signal translating elements, they are also characterized by the advantages which are inherent in such devices such as ruggedness and a relatively long useful life, and are, as a result, suitable for many different applications.

What is claimed is:

1. In a signal generating system, the combination comprising an oscillator circuit and a first semi-conductor device therein of one conductivity type having a base, an emitter and a collector electrode, and means connected with said first semi-conductor device for generating sine-wave oscillations; amplitude modulation means including a second semi-conductor device of an opposite conductivity type and having an input, an output and a common electrode; means for applying energizing potentials to said first and second devices; means for applying modulation signals to the input electrode of said second device; and conductive circuit means connecting said second device with said first device to apply potential variations between the output and common electrodes of said second device between the collector and emitter electrodes of said first device to provide amplitude modulation of sine-wave oscillations generated thereby.

2. The combination as defined in claim 1 wherein said first semi-conductor device is a junction transistor of the P–N–P type and said second semi-conductor device is a junction transistor of the N–P–N type.

3. The combination as defined in claim 1 wherein said first semi-conductor device is a junction transistor of the N–P–N type and said second semi-conductor device is a junction transistor of the P–N–P type.

4. A semi-conductor signal modulation system comprising an oscillator circuit including a semi-conductor oscillator element and means including a frequency determining circuit and feedback means connected with said element for generating alternating current sine-wave signals having a predetermined frequency, said semi-conductor oscillator element comprising a first transistor of one conductivity type having a base, a collector and an emitter electrode cooperatively associated therewith, a semi-conductor amplitude modulation element comprising a second transistor of an opposite conductivity type and having an input circuit and an output circuit connected therewith, means for applying modulation signals to said input circuit, and means connecting said output circuit with the collector and emitter electrodes of said first transistor to provide a continuous direct current conductive path including the output circuit of said second transistor and the collector and emitter electrodes of said first transistor and providing amplitude modulation of said oscillator circuit.

5. In combination with an oscillator circuit including a point of reference potential and a first semi-conductor device therein of one conductivity type having a base, an emitter and a collector electrode, and means connected with said first semi-conductor device for generating sine-wave signals having a predetermined frequency; an amplitude modulation means including a second semi-conductor device of an opposite conductivity type and having a second base, a second emitter and a second collector electrode; means for applying energizing potentials to said first and second devices; means connecting the emitter electrode of said second device to said point of reference potential; means for applying modulation signals to the base electrode of said second device; and conductive circuit means connecting said second device with said first device to apply potential variations between the collector and emitter electrodes of said second device to the collector and emitter electrodes of said first device and provide amplitude modulation of said generated sine-wave signals.

6. A signal transmitter comprising, in combination, a first junction transistor of one conductivity type having a first semi-conductive body and a first emitter, a first base and a first collector electrode cooperatively associated therewith, an oscillator frequency determining circuit connected with said first base and said first emitter electrodes, means providing oscillator signals including a regenerative feedback path coupled with said first collector electrode, a second junction transistor of opposite conductivity type having a second semi-conductive body and a second emitter, a second base and a second collector electrode cooperatively associated therewith, means for applying modulation signals to said second base electrode, means providing a source of reference potential, means connecting said second emitter electrode with said source, means including a source of operating bias potential connected between said source of reference potential and said first emitter electrode, and means including said feedback path connecting said first collector electrode with said second collector electrode whereby potential variations between the collector and emitter electrodes of said second transistor are applied between the collector and emitter electrodes of said first transistor to provide amplitude modulation of said oscillator signals.

7. A signal transmitter comprising, in combination, a first junction transistor of one conductivity type having a first semi-conductive body and a first emitter, a first base and a first collector electrode cooperatively associated therewith, an oscillator frequency determining circuit connected with said first base and said first emitter electrodes, means providing oscillator signals including a regenerative feedback path coupled with said first collector electrode, a second junction transistor of an opposite conductivity type having a second semi-conductive body and a second emitter, a second base and a second collector electrode cooperatively associated therewith, means for applying modulation signals to said second base electrode, a source of reference potential, means connecting said collector electrode with said source, means including a source of operating bias potential and said feedback path connected between said source of reference potential and said first collector electrode, and means connecting said first emitter electrode with said second emitter electrode whereby potential variations between the emitter and collector electrodes of said second transistor are applied between the emitter and collector electrodes of said first transistor to provide amplitude modulation of said oscillator signals.

8. In combination with an oscillator circuit including a point of reference potential and a first semi-conductor device therein of one conductivity type having a base, an emitter and a collector electrode, and means connected with said first semi-conductor device for generating sine-wave oscillations having a predetermined frequency; an amplitude modulation means including a second semi-conductor device of an opposite conductivity type and having a second base, a second emitter and a second collector electrode; means for applying energizing potential to said first and second devices; means connecting the collector electrode of said second device to said point of reference potential; means for applying modulation signals to the base electrode of said second device, and conductive circuit means connecting said second device with said first device for applying potential variations between the emitter and collector electrodes of said second device to the emitter and collector electrodes of said first device and to provide amplitude modulation of said sine-wave oscillations.

9. A semi-conductor modulation circuit comprising a signal generator including a semi-conductor oscillator element and means connected therewith for generating sine-wave oscillations having a predetermined frequency, said semi-conductor oscillator element comprising a semi-conductive body of one conductivity type having a base, a collector and an emitter electrode cooperatively associated therewith, a semi-conductor amplitude modulating element comprising a semi-conductor device of an opposite conductivity type and having an input circuit and an output circuit connected therewith, means for applying modulation signals to said input circuit, and means connecting said output circuit with the collector and emitter electrodes of said semi-conductor oscillator element to provide amplitude modulation of said signal generator.

10. The combination with an oscillator circuit and a first transistor therein of one conductivity type having a first base, a first emitter and a first collector electrode, and means connected with said first transistor for generating sine-wave oscillator signals having a predetermined frequency; of amplitude modulation means including a second transistor of an opposite conductivity type and having a second base, a second emitter and a second collector electrode; means for applying energizing potentials to said first and second transistors; means for applying modulation signals to the base electrode of said second transistor; and conductive circuit means connecting said second transistor with said first transistor to apply potential variations occurring between the collector and emitter electrodes of said first transistor to the collector and emitter electrodes of said second transistor to provide amplitude modulation of said oscillator signals, said conductive circuit means providing a continuous direct current conductive path between said first and second transistors including the emitter and collector electrodes thereof.

11. In combination with a sine-wave oscillator circuit and a first transistor therein of one conductivity type having a base, an emitter and a collector electrode, and means connected in circuit with said first transistor including a feedback coupling element connected with said collector electrode for generating sine-wave oscillations; an amplitude modulation means for amplitude modulating said generated sine-wave oscillations including a second transistor of an opposite conductivity type and having an input electrode, a common electrode and an output electrode; input circuit means for applying modulation signals to said input electrode; and direct current conductive circuit means connecting said common and output electrodes, said feedback coupling element and said collector and emitter electrodes in series for applying potential variations between the output and common electrodes of said second transistor to the collector and emitter electrodes of said second transistor to provide amplitude modulation of said sine-wave oscillations.

References Cited in the file of this patent

UNITED STATES PATENTS

| | | |
|---|---|---|
| 2,486,776 | Barney | Nov. 1, 1949 |
| 2,663,800 | Herzog | Dec. 22, 1953 |

OTHER REFERENCES

RCA Review, March 1949, page 14.